United States Patent [19]

Lawson

[11] 4,401,131
[45] Aug. 30, 1983

[54] APPARATUS FOR CLEANING SEMICONDUCTOR WAFERS

[75] Inventor: Robert M. Lawson, San Jose, Calif.

[73] Assignee: GCA Corporation, Bedford, Mass.

[21] Appl. No.: 264,097

[22] Filed: May 15, 1981

[51] Int. Cl.³ .............................................. B08B 3/12
[52] U.S. Cl. ..................................... 134/149; 134/184
[58] Field of Search ............................ 134/1, 149, 184

[56] References Cited

U.S. PATENT DOCUMENTS

| 3,445,092 | 5/1969 | Fierle et al. | 134/184 X |
| 4,064,885 | 12/1977 | Dussault et al. | 134/149 X |
| 4,103,519 | 8/1978 | Davidson | 134/1 X |
| 4,183,011 | 1/1980 | Massa | 134/184 |
| 4,326,553 | 4/1982 | Hall | 134/1 X |

OTHER PUBLICATIONS

Jensen, "Polishing Silicon Wafers", 1966, (See FIGS. 1 & 2 on p. 9).

Primary Examiner—Robert L. Bleutge
Attorney, Agent, or Firm—Kenway & Jenney

[57] ABSTRACT

The cleaning apparatus disclosed herein employs ultrasonic energy applied through a transducer face which overlies the entire wafer face. A cleaning liquid is introduced through the center of the transducer faceplate into the gap between the wafer and the faceplate. The transducer includes a plurality of piezoelectric transducer elements annularly distributed around the faceplate which are energized for synchronous vibration to provide an essentially uniform acoustic field over the faceplate. The faceplate is essentially flat over a majority of its surface but includes a plurality of grooves facilitating the venting of vapors created by cavitation during cleaning.

11 Claims, 5 Drawing Figures

APPARATUS FOR CLEANING SEMICONDUCTOR WAFERS

BACKGROUND OF THE INVENTION

The present invention relates to ultrasonic cleaning of semiconductor wafers and more particularly to a method of cleaning wafers sequentially as part of an in-line semiconductor manufacturing process.

While ultrasonic cleaning of semiconductor wafers has been proposed heretofore, such proposals have met with very limited success and acceptance by the industry. While batch cleaning in tanks has been used for some steps of semiconductor manufacturing, in-line ultrasonic cleaning of successive wafers as part of a continuous semiconductor manufacturing process has not been successfully implemented, notwithstanding some considerable experimentation.

Among the several objects of the present invention may be noted the provision of apparatus for cleaning the surface of a semiconductor wafer; the provision of such apparatus which is highly effective in thoroughly cleaning the water's surface; the provision of such apparatus which will evenly clean the entire wafer surface; the provision of such apparatus which operates quickly and reliably; the provision of such apparatus which is suitable for individually cleaning successive wafers as part of an in-line semiconductor manufacturing process; and the provision of such apparatus which is of relatively simple and inexpensive construction. Other objects and features will be in part apparent and in part pointed out hereinafter.

SUMMARY OF THE INVENTION

Briefly, the apparatus of the present invention operates to clean semiconductor wafers by the application of ultrasonic energy uniformly over the wafer's entire surface. To this end, a transducer assembly is provided having a faceplate which fully overlies the wafer. Liquid is introduced, through the center of the faceplate, into a gap between the wafer and the faceplate. The faceplate is then vibrated to generate an essentially uniform acoustic field over the faceplate. The faceplate is essentially flat over a majority of the surfaces facing the wafer but includes also a plurality of grooves facilitating the venting of vapors created by cavitation during cleaning. By this means, a relatively high power acoustic field may be applied to effect very thorough cleaning in a relatively short period of time.

BRIEF DESCRIPTION OF THE DRAWINGS

Corresponding reference characters indicate corresonding parts throughout the several views of the drawings.

DESCRIPTION OF THE PREFERRED EMBODIMENT

Figure 1:
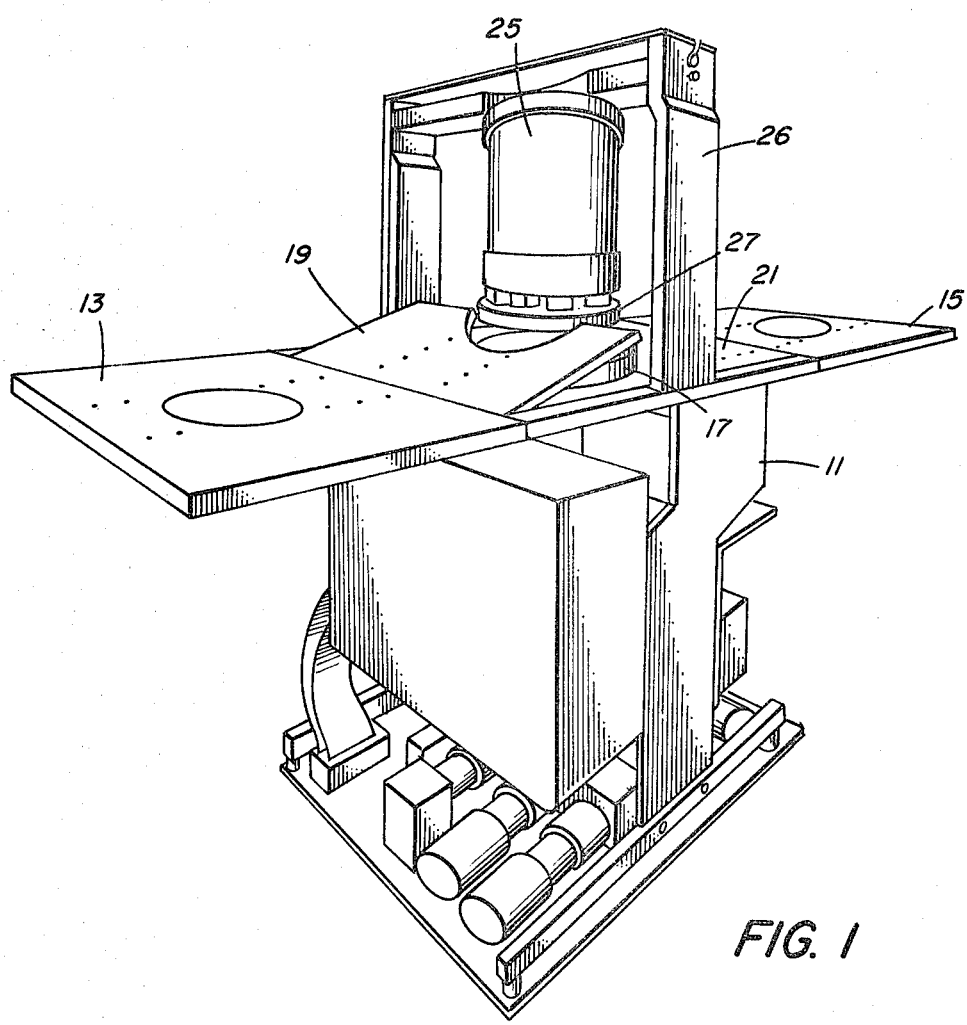
FIG. 1 is a propsective view of apparatus constructed in accordance with the present invention showing its incorporation into an in-line semiconductor manufacturing process.

Referring now to FIG. 1, there is illustrated a portion of an in-line semiconductor manufacturing line in which wafers of a semiconductor material, e.g. silicon, are transported from work station to work station by an air bearing handling system. The overall handling system is of the type sold by GCA Corporation under its trademark WAFERTRACK.

A wafer cleaning station constructed according to the present invention is indicated generally by reference character 11 and wafer handling air tracks for transporting wafers into and out of the cleaning station are indicated generally by reference character 13 and 15. The work station 11 includes a wafer-holding vacuum chuck, indicated generally by a reference character 17. As is understood, such chucks are widely used in semiconductor manufacturing processes and thus its operation is not described in detail herein.

Figure 3:
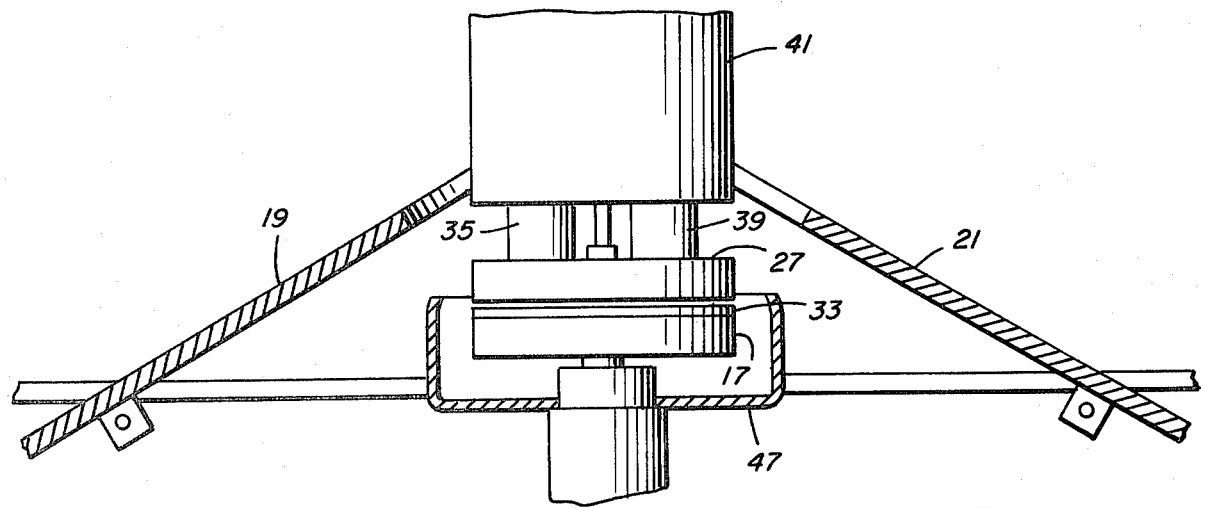
FIG. 3 is a side view, in section, similar to that of FIG. 2 but showing various parts moved into the positions assumed during actual cleaning.

The cleaning station itself incorporates short sections of air track, designated 19 and 21, which are shaped to mate with the chuck and to facilitate the transport of a wafer to the chuck for cleaning and away from the chuck after cleaning. As indicated in FIG. 3, these sections of track may be raised in drawbridge fashion to somewhat shroud and enclose the wafer held in the chuck during cleaning.

Positioned above and in alignment with the chuck 17 is an ultrasonic transducer assembly 25 supported by a frame 26. The bottom of assembly 25 comprises a transducer faceplate 27 which is large enough to fully overlie a wafer to be cleaned, that is, it is approximately the same size as the wafer or slightly larger. The embodiment illustrated is designed to clean standard 100 mm. wafers and the faceplate is also 100 mm. in diameter.

Figure 4:
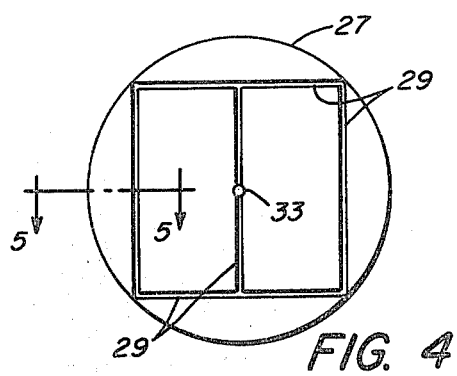
FIG. 4 is a face view of the ultrasonic transducer assembly employed in the apparatus of FIGS. 1–3.
Figure 5:
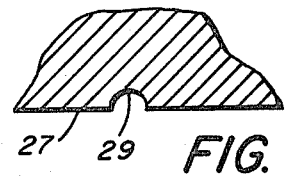
FIG. 5 is a view, in section, of a groove provided in the faceplate of FIG. 4, taken substantially on the line 4—4 of FIG. 4.

The bottom of faceplate 27 is flat over most of its surface, as is conventional with large-faced ultrasonic transducers, but includes a plurality of grooves 29 distributed over the face. The pattern of the grooves 29 is illustrated in FIG. 4 with the cross-section of an individual groove being illustrated in FIG. 5. As is described in greater detail hereinafter, the function of these grooves is to facilitate venting of vapors created by cavitation during cleaning so that the vapors do not interfere with the coupling of acoustic energy from the faceplate 27 to the wafer being cleaned. In the preferred embodiment illustrated, the grooves 29 are twenty thousandths of an inch wide and ten thousandths deep. The preferred groove pattern may conveniently be described as a "boxed H". As may be seen in FIG. 4, the faceplate 27 includes a central aperture 33 through which a cleaning liquid may be introduced into the space between transducer faceplate and a wafer being cleaned.

The faceplate 27 is vibrated by four piezoelectric transducer elements 35–39 distributed around the backside of the faceplate 27 in an annular array. When the transducer assembly 25 is operated, the elements 35–39 are energized for synchronous longitudinal vibration, i.e. vertical vibration, so as to provide an essentially uniform acoustic field over the faceplate. This is in distinction to the usual large transducer elements utilizing single elements which generate acoustic fields which are highly non-uniform across the transducer face, being strongest in the center and weaker toward the edges. Suitable driving electronics may be incorporated in the transducer assembly housing 41.

Figure 2:
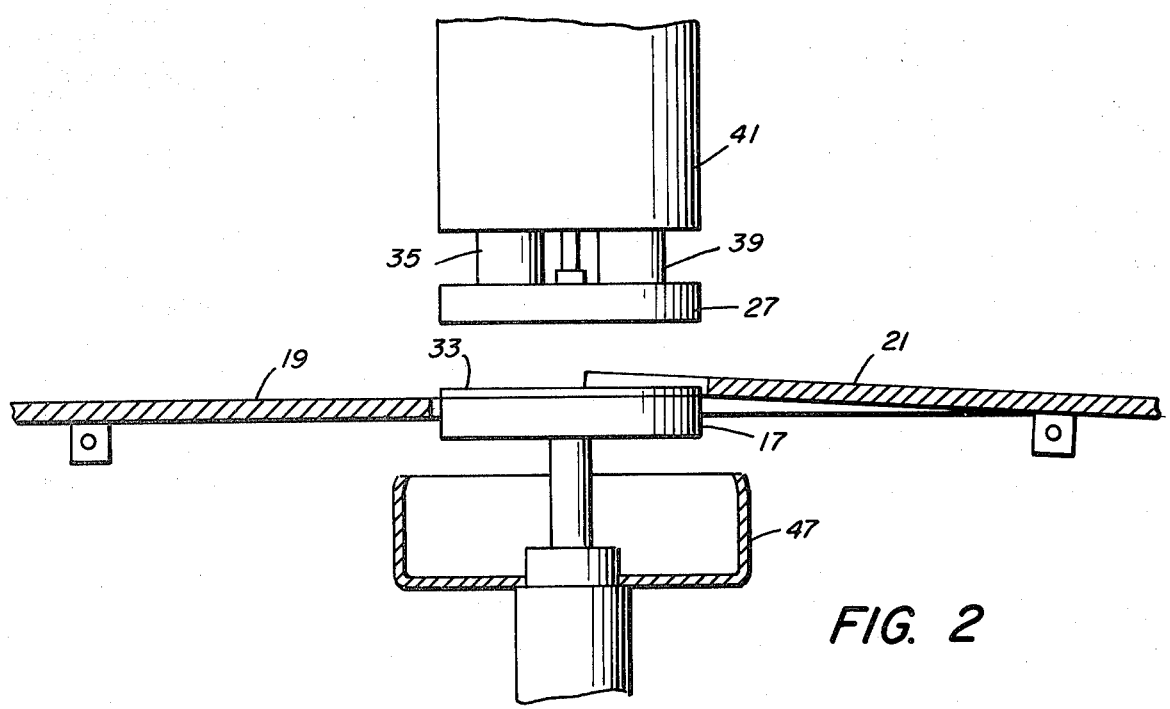
FIG. 2 is a side view, in section, of the cleaning apparatus of FIG. 1.

In operation, a wafer is brought into the cleaning station as illustrated in FIG. 2, the outgoing track section 21 being raised slightly to act as a stop for the wafer, a typical wafer being indicated generally by reference character 33. Once the wafer is acquired by the chuck and vacuum has been applied to hold the wafer securely to the chuck, the chuck is raised so as to be in close proximity with the faceplate 27 of the transducer assembly, as illustrated in FIG. 3. Presently, a spacing of 30 to 40 thousandths of an inch is preferred. Simultaneously, a cup assembly 47 is raised around the chuck 17 as shown in FIG. 3. The operation of the cup assembly 47 is to collect the cleaning fluid during cleaning and subsequent spin drying, such cup assemblies being conventionally employed in semiconductor manufacturing steps such as coating and spinning of photoresists.

Once the chuck and cup assemblies are properly positioned, a cleaning fluid is introduced through the central aperture 33 of the faceplate. As is understood, the liquid acts not only as a cleaner itself but also a medium through which ultrasonic energy is coupled from the faceplate to the surface of the wafer so as to dislodge contaminants or coatings to be removed. The rate of liquid flow is determined largely by the spacing of the gap between the transducer faceplate 27 and the wafer.

Once liquid has flooded the gap between the faceplate and the wafer, the ultrasonic transducer 25 may be energized. In accordance with the practice of the present invention, relatively high power levels can be applied to effect a rapid and thorough cleaning, e.g. four hundred watts in the case of a 100 mm. wafer. Not only is the entire surface of the water subject to simultaneous cleaning, but the cleaning is relatively uniform since the acoustic energy is applied by multiple transducers distributed around the faceplate. Further, it has been found that a surprising increase in the usable power level can be achieved by the use of grooves in the faceplate as illustrated in FIG. 4.

While a narrow gap between the faceplate and the wafer is desired in order to effect best coupling of the ultrasonic energy, the formation of vapors by cavitation can displace the liquid and interfere with proper coupling. The apparent effect of the grooves distributed over the faceplate is to allow venting of these vapors and permitting a greater concentration of the available liquid in the gap. This liquid then effectively couples the ultrasonic energy maximizing the cleaning effect. In general, it is believed that a substantial increase in power density can be obtained through the use of the central liquid feed and the vapor venting grooves. At the higher power levels possible with the transducer illustrated in FIG. 4, it has been found that a thorough cleaning of a wafer surface may be accomplished in less than one minute.

After ultrasonic cleaning is completed, the flow of liquid is terminated and the wafer is spun on the chuck to remove excess liquid. Following this step, the cup is lowered, as are the track sections 19 and 21, and the wafer is taken away from the cleaning station and the cycle may then be repeated. As is understood in the art, the chuck 17 will also be provided with air bearing ports to initially lift and start the wafer on its way in addition to the vacuum ports used for clamping the wafer during cleaning.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

I claim:

1. Apparatus for cleaning semiconductor wafers comprising:

a chuck for holding a semiconductor wafer to be cleaned;

above and aligned with said chuck, an ultrasonic transducer provided with a faceplate which fully overlies a wafer held in the chuck;

drive means interconnecting said chuck and said transducer for bringing a wafer held in the chuck into face-to-face, closely spaced proximity to said transducer and for rotating the wafer during cleaning;

means including an aperture in said faceplate for introducing a liquid into the gap between the wafer and the faceplate; and means for energizing said transducer to provide an essentially uniform acoustic field over said faceplate, said faceplate being flat over the majority of the surface facing the wafer but including also a plurality of grooves facilitating the venting of vapors created by cavitation during cleaning.

2. Apparatus as set forth in claim 1 wherein said faceplate is circular and said grooves are in a "boxed H" pattern.

3. Apparatus as set forth in claim 2 wherein said aperture through which said liquid is introduced into the gap between the wafer and the faceplate is centrally located in said faceplate.

4. Apparatus as set forth in claim 1 wherein said faceplate is in the order of four inches in diameter and said grooves are about 0.020 inch wide and about 0.010 inch deep.

5. Apparatus for cleaning semiconductor wafers comprising:

a chuck for holding a semiconductor wafer to be cleaned;

above and aligned with said chuck, an ultrasonic transducer assembly provided with a faceplate which fully overlies a wafer held in the chuck;

said transducer assembly including a plurality of piezoelectric transducer elements annularly distributed around said faceplate for vibrating the faceplate;

drive means interconnecting said chuck and said transducer assembly for bringing a wafer held in the chuck into face-to-face, closely spaced proximity to said transducer and for rotating the wafer during cleaning;

means for introducing a liquid through the center of the faceplate into the gap between the wafer and the faceplate; and means for energizing said transducer elements to provide an essentially uniform acoustic field over said faceplate, said faceplate being flat over the majority of the surface facing the wafer but including also a plurality of grooves facilitating the venting of vapors created by cavitation during cleaning.

6. Apparatus as set forth in claim 5 including an air track system for transporting successive wafers to said chuck for cleaning and away from said chuck after cleaning.

7. Apparatus as set forth in claim 5 wherein said transducer element generates vertical vibration when energized by said energizing means.

8. Apparatus as set forth in claim 5 wherein said grooves are arranged in a "boxed H" pattern over the lower face of said faceplate.

9. Apparatus for cleaning semiconductor wafer comprising:

a chuck for holding a semiconductor wafer to be cleaned;

means for transporting successive semiconductor wafers to said chuck for cleaning and thereafter removing each wafer after cleaning;

above and aligned with said chuck, an ultrasonic transducer assembly provided with a faceplate which fully overlies of wafer held in the chuck;

said transducer assembly including a plurality of piezoelectric transducer elements annularly distributed around said faceplate for vibrating the faceplate;

drive means interconnecting said chuck and said transducer assembly for bringing a wafer held in the chuck into face-to-face, closely spaced proximity to said transducer and for rotating the wafer during cleaning;

means for introducing a liquid through the center of the faceplate into the gap between the wafer and the faceplate; and means for energizing said transducer element for synchronous vertical vibration to provide an essentially uniform acoustic field over said faceplate, said faceplate being flat over the majority of the surface facing the wafer but including also a plurality of grooves facilitating the venting of vapors created by cavitation during cleaning.

10. Apparatus as set forth in claim 9 wherein said grooves are arranged in a pattern including a "boxed H" formation.

11. Apparatus as set forth in claim 9 wherein said transporting means is an air track conveying system.

* * * * *